US009831186B2

(12) United States Patent
Park et al.

(10) Patent No.: US 9,831,186 B2
(45) Date of Patent: Nov. 28, 2017

(54) METHODS OF MANUFACTURING SEMICONDUCTOR DEVICES USING ALIGNMENT MARKS TO ALIGN LAYERS

(71) Applicant: Samsung Electronics Co., Ltd., Suwon-si (KR)

(72) Inventors: Ki-hyun Park, Yongin-si (KR); Byoung-ho Kwon, Hwaseong-si (KR); Dong-chan Kim, Suwon-si (KR); Choong-seob Shin, Uiwang-si (KR); Jong-su Kim, Seoul (KR); Bo-un Yoon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 238 days.

(21) Appl. No.: 14/736,455

(22) Filed: Jun. 11, 2015

(65) Prior Publication Data

US 2016/0027739 A1 Jan. 28, 2016

(30) Foreign Application Priority Data

Jul. 25, 2014 (KR) ........................ 10-2014-0095002

(51) Int. Cl.

| | |
|---|---|
| ***H01L 21/66*** | (2006.01) |
| ***H01L 23/544*** | (2006.01) |
| ***H01L 21/4757*** | (2006.01) |
| ***H01L 21/768*** | (2006.01) |

(52) U.S. Cl.

CPC ...... *H01L 23/544* (2013.01); *H01L 21/47573* (2013.01); *H01L 21/7684* (2013.01); *H01L 21/76802* (2013.01); *H01L 21/76807* (2013.01); *H01L 22/12* (2013.01); *H01L 2223/5446* (2013.01); *H01L 2223/54426* (2013.01); *H01L 2924/0002* (2013.01)

(58) Field of Classification Search

CPC ............. H01L 23/544; H01L 21/47573; H01L 21/76802; H01L 21/76807; H01L 21/7684

See application file for complete search history.

(56) References Cited

U.S. PATENT DOCUMENTS 8,692,384 B2 * 4/2014 Nakamura ........ H01L 21/76898 257/682
2004/0140052 A1 7/2004 Han
2005/0196951 A1 9/2005 Lin et al.
2008/0153198 A1 6/2008 Moon
2008/0157384 A1 7/2008 Jeon
(Continued)

FOREIGN PATENT DOCUMENTS

JP 2007-123781 5/2007
JP 2008-135671 6/2008
(Continued)

*Primary Examiner* — Bradley K Smith
(74) *Attorney, Agent, or Firm* — Myers Bigel, P.A.

(57) ABSTRACT

A method of manufacturing a semiconductor device includes forming a first alignment mark trench in a first material layer on a substrate. A first alignment mark via may then be formed by etching a second material layer that is underneath the first material layer, where the first alignment mark via is positioned to communicate with the first alignment mark trench. Then, a trench-via-merged-type first alignment mark may be formed by filling the first alignment mark trench and the first alignment mark via with a light reflection material layer.

20 Claims, 13 Drawing Sheets

(56) References Cited

U.S. PATENT DOCUMENTS

2008/0318389 A1 12/2008 Kim
2010/0227451 A1 9/2010 Suzuki
2013/0020721 A1* 1/2013 Nakae .................. G03F 9/7084
257/774
2017/0025349 A1* 1/2017 Wood ................ H01L 21/76898

FOREIGN PATENT DOCUMENTS

KR 10-0800786 B1 1/2008
KR 1020080019415 A 3/2008
KR 1020100078947 A 7/2010

* cited by examiner

METHODS OF MANUFACTURING SEMICONDUCTOR DEVICES USING ALIGNMENT MARKS TO ALIGN LAYERS

CROSS-REFERENCE TO RELATED APPLICATION

This application claims priority under 35 U.S.C. §119 from Korean Patent Application No. 10-2014-0095002, filed on Jul. 25, 2014 in the Korean Intellectual Property Office, the disclosure of which is incorporated herein in its entirety by reference.

BACKGROUND

The inventive concepts relate to methods of manufacturing semiconductor devices, and more particularly, to methods of manufacturing semiconductor devices that include alignment marks.

A semiconductor integrated circuit (IC) may be formed by stacking a plurality of layers that have circuits formed therein. The manufacture of the IC involves using a plurality of photomask patterns that define circuit patterns in each of the layers. The photomask patterns may need to be precisely aligned with one another.

SUMMARY

The inventive concepts provide a method of manufacturing a semiconductor device in which a high-quality alignment mark is formed in spite of a step difference in a substrate and layers are aligned at a high precision by using the alignment mark.

According to an aspect of the inventive concepts, there is provided a method of manufacturing a semiconductor device. The method includes sequentially forming a second material layer and then a first material layer on a top surface of a substrate, forming a first alignment mark trench in the first material layer, forming a first alignment mark via under the first alignment mark trench by etching the second material layer, wherein the first alignment mark via is configured to communicate with the first alignment mark trench, forming a trench-via-merged-type first alignment mark by at least partially filling the first alignment mark trench and the first alignment mark via with a light reflection material layer, and using the trench-via-merged-type first alignment mark to align a pattern in a third material layer with a pattern in at least one of the first or second material layers.

In some embodiments, the method may further include forming a first circuit pattern in the first material layer simultaneously with the forming of the first alignment mark trench in the first material layer, forming a first circuit region via in the second material layer that is in communication with the first circuit pattern simultaneously with the formation of the first alignment mark via in the second material layer, and at least partially filling the first circuit pattern and the first circuit region via.

The first circuit may be a metal interconnection.

The method may further include forming a third material layer after forming the first circuit and the first alignment mark, forming a second alignment mark trench in the third material layer, forming a second alignment mark that is in communication with the second alignment mark trench, and forming a second alignment mark by at least partially filling the second alignment mark via and the second alignment mark trench with a light reflection material.

The second alignment mark trench may be formed in a different position from the first alignment mark trench in the substrate in a direction parallel to the substrate.

In some embodiments, the method may further include forming a second circuit pattern in the third material layer simultaneously with the formation of the second alignment mark trench in the third material layer, forming a second circuit region via in the third material layer that is in communication with the second circuit pattern simultaneously with the formation of the second alignment mark via, and at least partially filling the second circuit pattern and the second alignment mark via with a conductive material.

The formation of the first alignment mark via may include forming a mask pattern on the first material layer that has an opening above the first alignment mark trench. A first width of the first alignment mark trench may be less than a second width of the opening.

The first alignment mark trench may include at least one wall defining a plurality of slits.

A top surface of the first alignment mark may be at a lower level than a top surface of the first material layer.

The light reflection material may include at least one of a metal or an insulating material.

The formation of the first alignment mark trench may include forming a multi-layer hard mask pattern on the first material layer.

The method may further include forming a fourth material layer between the first material layer and the second material layer using the first alignment mark to align a pattern in the fourth material layer with a pattern in the first material layer.

According to another aspect of the inventive concept, there is provided a method of manufacturing a semiconductor device. The method includes forming a first layer on a substrate, forming an alignment mark trench in the first layer, forming a mask pattern on the first layer, the mask pattern having an opening above the alignment mark trench, forming an alignment mark via in a second layer that is in communication with the alignment mark trench by etching the second layer using the mask pattern as an etch mask, forming an alignment mark by at least partially filling the alignment mark trench and the alignment mark via with a light reflection material, forming a third layer on the first layer, and using the alignment mark to align a pattern in the third layer with a pattern in one of the first or second layers.

In some embodiments, the method may further include forming a circuit pattern in a chip region of the substrate simultaneously with the formation of the alignment mark trench, forming a circuit region via that is in communication with the circuit pattern simultaneously with the formation of the alignment mark via, and at least partially filling the circuit pattern and the circuit region via with a conductive material.

In some embodiments, a plurality of alignment marks may be formed, and at least one of the plurality of alignment marks may be formed in a chip region of the substrate.

In some embodiments, a plurality of alignment marks may be formed, and at least one of the plurality of alignment marks may be formed in a scribe lane region of the substrate.

In some embodiments, a plurality of alignment marks may be formed and form a plurality of alignment mark groups.

In some embodiments, a plurality of alignment marks may be formed, and at least two of the plurality of alignment marks may have different shapes.

According to another aspect of the inventive concept, there is provided a process monitoring method including forming an alignment mark trench and a circuit pattern in a material layer on a substrate, forming an alignment mark via and a circuit via to communicate with the alignment mark trench and the circuit pattern, respectively, forming an alignment mark and a circuit by filling the alignment mark via and the circuit via with a light reflection material and a conductive material, respectively, radiating light to the material layer and detecting signals reflected by the alignment mark to obtain an alignment position offset of the alignment mark, and obtaining information regarding each position of the material layer using the alignment position offset.

The information may be information regarding a thickness of each position of the substrate.

According to another aspect of the inventive concept, there is provided a method of manufacturing a semiconductor device in which a first circuit is formed in a recess in a top surface of a first portion of the substrate. A second material layer and a first material layer are sequentially formed on the top surface of the substrate that includes the first circuit. An alignment mark trench is formed in the first material layer. The second material layer is etched underneath the alignment mark trench to form an alignment mark via in the second material layer under the alignment mark trench. A reflective material is deposited in the alignment mark trench and in the alignment mark via. An alignment mark is formed by removing at least some of the reflective material. A third material layer is formed on the first material layer. Finally, light reflected from the alignment mark is detected to determine an alignment position offset that is used to form an opening in the third material layer that is aligned with a pattern in one of the first material layer, the second material layer or the substrate.

In some embodiments, the alignment mark via may extend all the way through the second material layer and into a top surface of a second portion of the substrate.

In some embodiments, removing at least some of the reflective material may comprise removing all of the reflective material that was deposited in the alignment mark trench.

In some embodiments, etching the second material layer underneath the alignment mark trench to form the alignment mark via in the second material layer may comprise forming a mask pattern having an opening above the alignment mark trench on the first material layer and then etching the second material layer using the mask pattern as an etching mask, where the opening in the mask pattern has a width that exceeds a width of the first alignment trench.

In some embodiments, the method may further include forming a first circuit pattern in the first material layer in the same processing operation that forms the alignment mark trench in the first material layer.

In some embodiments, the mask pattern may be a multi-layer mask pattern.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
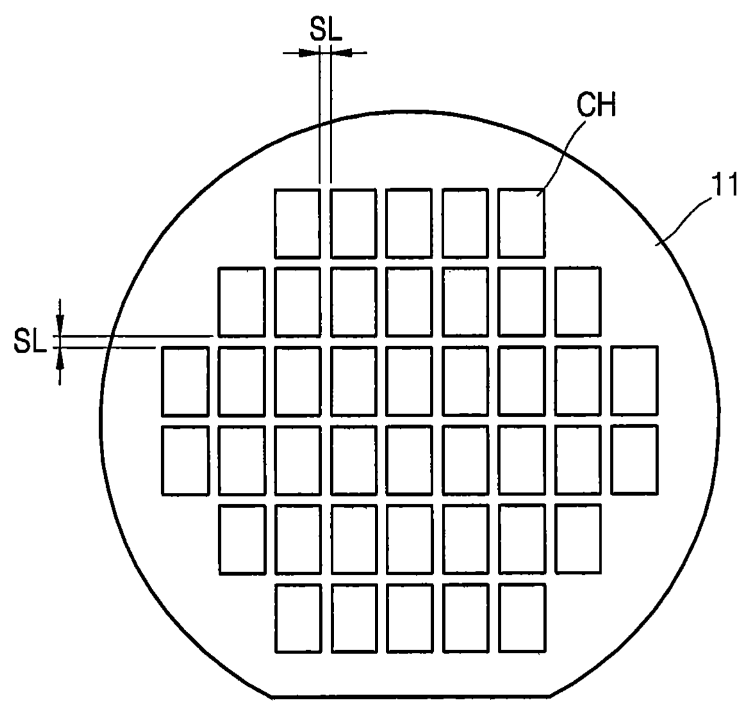
FIGS. 1 and 2 are plan views of a semiconductor substrate that includes a plurality of chip regions according to example embodiments of the inventive concepts.

The inventive concepts will now be described more fully with reference to the accompanying drawings, in which example embodiments are shown. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art.

Like reference numerals in the specification and drawings denote like elements. As used herein, the term "and/or" includes any and all combinations of one or more of the associated listed items. Expressions such as "at least one of" when preceding a list of elements, modify the entire list of elements as opposed to the individual elements of the list.

It will be understood that, although the terms "first", "second", etc. may be used herein to describe various elements, components, regions, layers and/or sections, these elements, components, regions, layers and/or sections should not be limited by these terms. These terms are not used, for example, to describe specific orders, but instead are only used to distinguish one element, component, region, layer or section from another element, component, region, layer or section. Thus, a first element, component, region, layer or section discussed below could be termed a second element, component, region, layer or section without departing from the teachings of the inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless explicitly so defined herein.

While the example embodiments disclosed herein may describe various processing steps as occurring in a certain order, it will be appreciated that this order may be varied in other embodiments. Thus, for example, two process steps described in a sequential order herein may be performed at substantially the same time or in reverse order in other embodiments. Likewise, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Figure 2:
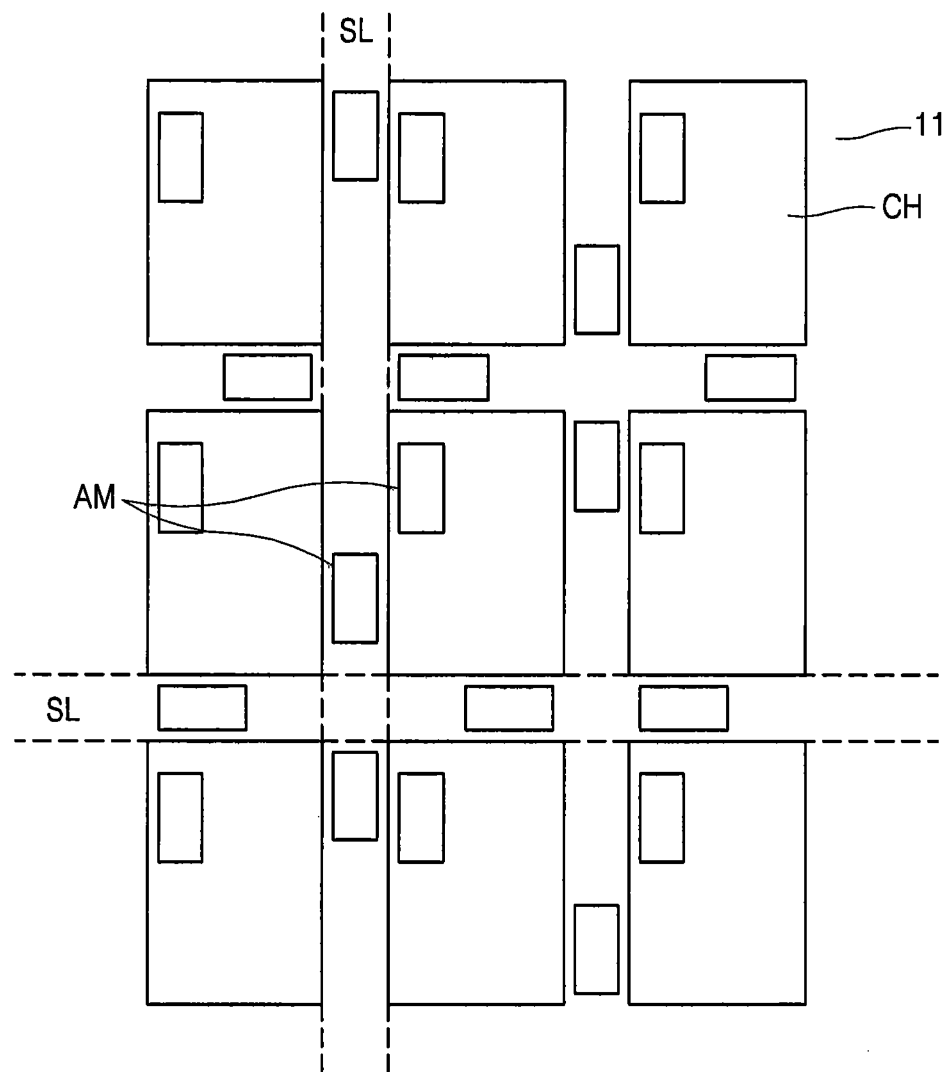

FIGS. 1 and 2 are plan views illustrating a method of manufacturing a semiconductor substrate that includes a plurality of chip regions according to example embodiments of the inventive concepts.

As shown in FIG. 1, the semiconductor device includes a semiconductor substrate 11. A plurality of chip regions CH including circuits are formed on the semiconductor substrate 11, and scribe lane regions SL are provided between the chip regions CH to isolate the chip regions CH from one another.

The chip regions CH may be regions in which circuits are formed, and the scribe lane regions SL may be cut lines that are used to dice the semiconductor substrate 11 into, a plurality of discrete chips after the circuits are formed in the chip regions CH.

Referring to FIG. 2, a plurality of alignment mark regions AM may be formed in the scribe lane regions SL and in the chip regions CH of the substrate 11.

The alignment mark regions AM may be used to align upper and lower ones of a plurality of material layers that are formed on the substrate when these material layers are patterned. Specifically, when an integrated circuit (IC) is manufactured, a plurality of material layers may be patterned by repeating a photolithography process and an etching process. In particular, a photomask may be formed on a material layer that is to be patterned, the photomask may be selectively exposed according to a pattern, and the exposed photomask may be developed to form a photomask pattern. Then, an etching process may be performed on the entire surface of the resultant structure so that the underlying material layer may be etched to have the same pattern as the photomask pattern. Thereafter, a process of forming a photomask pattern and a process of etching a material layer may be repetitively performed on some or all of the material layers that are sequentially stacked on the underlying material layer. In many cases, it may be important that the that are patterns sequentially formed in the stacked material layers should be precisely aligned with one another. Accordingly, an alignment mark that is used to align positions of an upper material layer and a lower material layer may be included in an alignment mark region AM of the lower material layer. Light may be radiated onto the lower material layer that includes the alignment mark region AM, and light reflected by the alignment mark region AM may be detected, and an alignment position offset of the alignment mark region AM may be obtained. The alignment position offset may be used for positional alignment when a subsequent upper material layer is patterned.

Since the alignment mark region AM may be covered as additional material layers are added to the stack, it may become difficult or impossible to detect the alignment mark region AM due to reflection of the radiated light. Thus, after an initial alignment mark region AM is formed, a subsequent alignment mark region (not shown) may be additionally formed in a subsequently formed material layer. In this case, the subsequent alignment mark region may not be formed in the same position as the initial alignment mark region AM, and may include a different number of alignment marks than are included in the initial alignment mark region AM.

FIG. 2 illustrates an example in which four alignment mark regions AM are formed around one chip region CH and one alignment mark region AM is formed inside the chip region CH. However, the inventive concepts are not limited thereto, and the number of alignment mark regions AM formed in the substrate 11 is not limited.

In some embodiments, at least one of the alignment mark regions AM may be formed in the chip region CH. In some embodiments, the alignment mark regions AM may only be formed in the chip region CH.

In some embodiments, at least one of the alignment mark regions AM may be formed in the scribe lane regions SL. In some embodiments, the alignment mark regions AM may only be formed in the scribe lane regions SL.

FIGS. 3 through 9 are cross-sectional views illustrating a method of manufacturing a semiconductor device according to example embodiments. In the figures, the same elements are denoted by the same reference numerals, and repeated descriptions thereof will be omitted.

Figure 3:
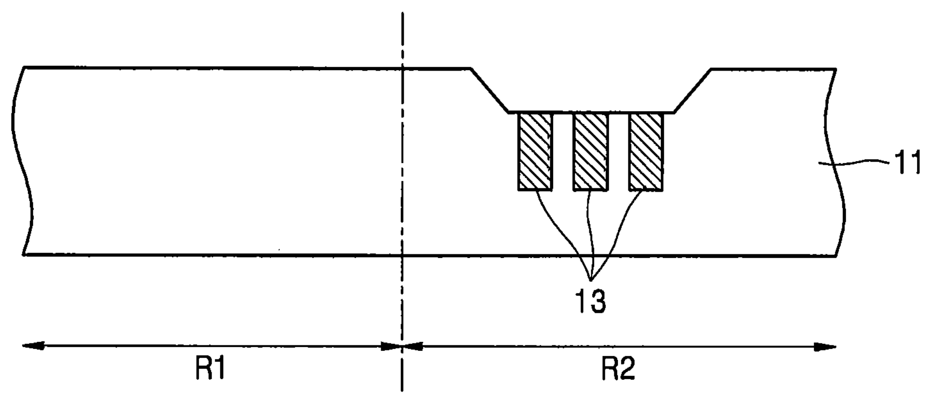
FIGS. 3 through 9B are cross-sectional views illustrating a method of manufacturing a semiconductor device according to example embodiments of the inventive concepts.

Referring to FIG. 3, a substrate 11 may include a first region R1 in which no circuit is formed and a second region R2 in which one or more circuits are formed. In the depicted example, a first circuit 13 is formed in the second region R2.

In some embodiments, the first region R1 may be one of the scribe lane regions SL of FIGS. 1 and 2, and the second region R2 may be one of the chip regions CH.

In some embodiments, the first region R1 and the second region R2 may each be chip regions CH of FIGS. 1 and 2. In this case, the first region R1 may be a portion of a chip region CH in which no circuit is formed.

The device of FIG. 3 may be formed by forming a first circuit pattern (not shown) on the substrate 11 that is used to form the first circuit 13. A conductive material may then be formed on the entire surface of the substrate 11 to cover the first circuit pattern. Thereafter, the entire surface of the resultant structure may be etched to form the first circuit 13, which may be formed of a conductive material which may be and node-separated (i.e., separated into at least two distinct nodes). In this case, the entire surface of the resultant structure may be largely etched in the portion of the second region R2 in which the first circuit 13 is formed, but only slightly etched in the first region R1 and in the remainder of the second region R2, thereby causing a step difference. As a result, a top surface of the first circuit 13 may be at a lower level than a top surface of the substrate 11. Even if a chemical mechanical polishing (CMP) process is performed on the exposed surface of a material layer under the same conditions, the material layer may be etched in a relatively large amount in a portion having a relatively high pattern density.

In some embodiments, the substrate 11 may include a semiconductor material, such as silicon (Si), germanium (Ge), silicon carbide (SiC), gallium arsenide (GaAs), indium arsenide (InAs), and indium phosphide (InP). In some embodiments, the substrate 11 may include a doped well or a doped structure.

In some embodiments, the conductive material used to form the first circuit 13 may be copper (Cu), aluminum (Al), tungsten (W), titanium (Ti), or a material containing at least one thereof.

In some embodiments, the etching of the exposed surface of the resultant structure may be performed using a CMP process.

Although not shown in FIGS. 3 through 15, the substrate 11 may include a basic wafer and at least one material layer formed on the basic wafer.

Although not shown in FIGS. 3 through 11, before the first circuit 13 is formed, an insulating layer containing at least one of oxide and nitride may be further formed on the substrate 11. FIGS. 3 through 11 illustrate only a method of forming patterns by using a damascene process, but the inventive concepts are not limited thereto. In some embodiments, the formation of patterns in a material layer may include first forming the material layer and then performing a photolithography process and an etching process on the material layer.

The inventive concepts are not limited by the structure of the circuit formed in the second region R2. It will be appreciated that the structure of the first circuit 13 that is illustrated in FIG. 3 is only an example and that any appropriate circuit design may be used.

Figure 4:
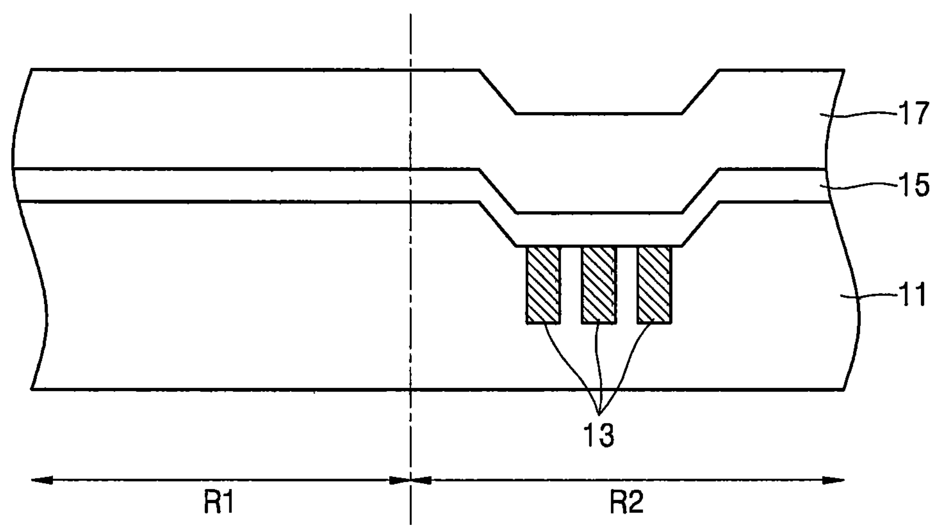

Referring to FIG. 4, an insulating layer 15 may be formed on the entire surface of the resultant structure, and a first material layer 17 may be formed on the insulating layer 15. As described with reference to FIG. 3, the top surface of the first circuit 13 may be at a lower level than the top surface of the substrate 11 so that a step difference exists in the area where the first circuit 13 is located. Since the insulating layer 15 and the first material layer 17 are designed to be formed on the entire surface of a wafer under the same conditions, this step difference may remain after formation of the insulating layer 15 and the first material layer 17.

Figure 5:
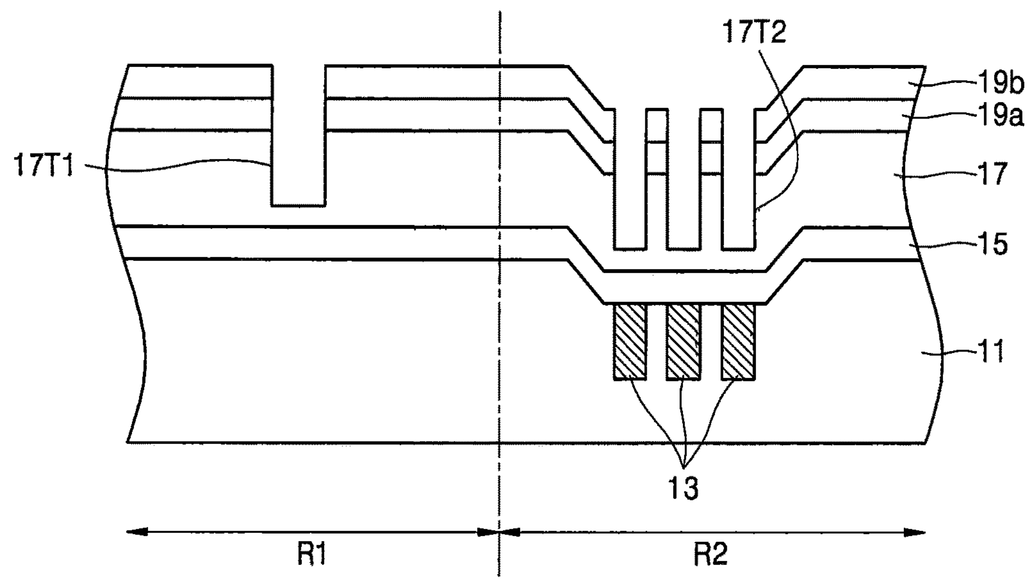

Referring to FIG. 5, a first mask pattern 19*a*, 19*b* may be formed on the resultant structure of FIG. 4. The first mask pattern 19*a*, 19*b* may be used for patterning an alignment mark and a second circuit. In particular, the first material layer 17 may be etched using the first mask pattern 19*a*, 19*b* as an etching mask. As a result of this etching operation, a first alignment mark trench 17T1 and a second circuit pattern 17T2 may be formed in the first material layer 17.

The first mask pattern 19*a*, 19*b* may be formed by forming a first mask layer (not shown) and a photomask pattern (not shown) on the first material layer 17. The photomask pattern may define the first alignment mark trench 17T1 and the second circuit pattern 17T2. The first mask layer may be etched using the photomask pattern as an etching mask to form the first mask pattern 19*a* and 19*b* on the first mask layer 17, where the first mask pattern 19*a*, 19*b* has the same pattern as the photomask pattern. The entire surface of the resultant structure having the first mask pattern 19*a*, 19*b* may then be etched so that the first alignment mark trench 17T1 is formed in the first material layer 17 in the first region R1 and the second circuit pattern 17T2 is formed in the first material layer 17 in the second region R2.

As shown in FIG. 5, the first mask pattern 19*a*, 19*b* may include a plurality of layers (in this particular embodiments two layers 19*a* and 19*b* are provided). In some embodiments, the first mask pattern 19*a*, 19*b* may have a structure in which silicon oxynitride (SiON) and titanium nitride (TiN) are sequentially stacked.

Although FIG. 5 illustrates a case in which there is a step difference in the first mask layer between the top surface of the first region R1 and a top surface of the portion of the second region R2 that is above the first circuit 13, the inventive concepts are not limited thereto. For example, in other embodiments, no step difference may be provided between the top surface of the first region R1 and the top surface of the second region R2. The step difference illustrated in FIG. 5 may be reduced or eliminated by, for example, forming the first mask layer to be very thick. The first alignment mark trench 17T1 and the second circuit pattern 17T2 may be formed regardless of whether or not the step difference is provided in the first mask layer.

Figure 6:
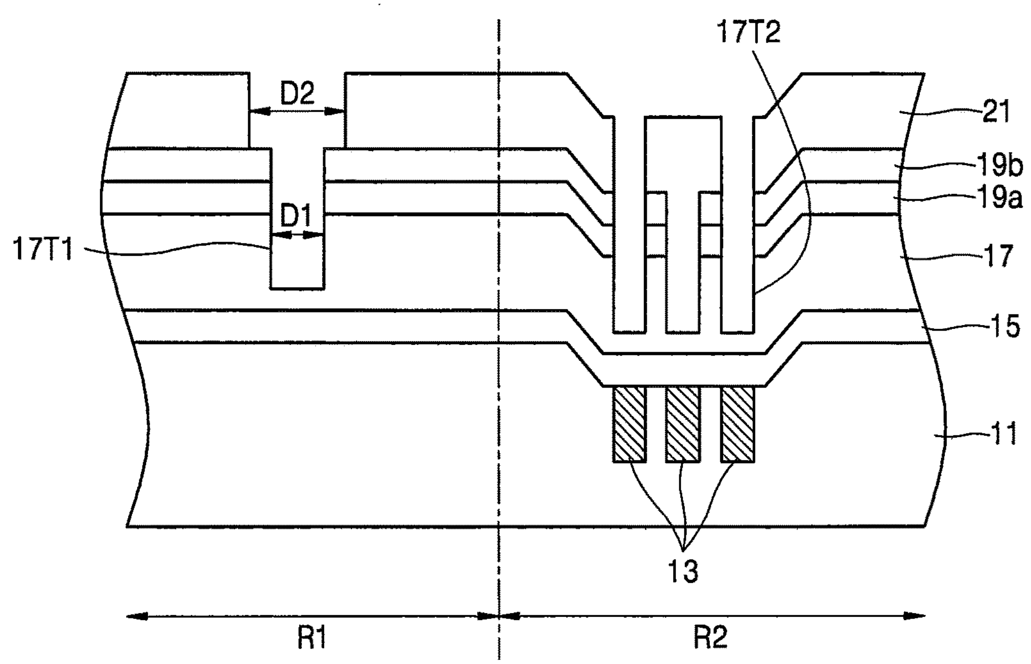

Referring to FIG. 6, a second mask pattern 21 may be formed on the resultant structure of FIG. 5 to define a first circuit region via (not shown) and a first alignment mark via (not shown) which are formed in subsequent operations that are discussed below with reference to FIG. 7.

In some embodiments, a width D1 of the first alignment mark trench 17T1 may be less than a width D2 of an opening in the second mask pattern 21 that is above the first alignment mark trench 17T1. As a result, even if the first alignment mark trench 17T1 is partially misaligned to some extent with the opening in the second mask pattern 21 in the first region R1, the first alignment mark trench 17T1 may still communicate with the opening in the second mask pattern 21 in the first region R1. Herein, trenches, openings and the like are referred to as being in "communication with" one another if they have openings which are at least partially aligned so that, for example, a fluid could pass from a first opening or trench to a second opening or trench.

The inventive concepts are not limited to the case of FIG. 6, and thus it will be appreciated that the width D2 of the opening in the second mask pattern 21 that is used to form the first alignment mark via may be equal to the width D1 of the first alignment mark trench 17T1.

Figure 7:
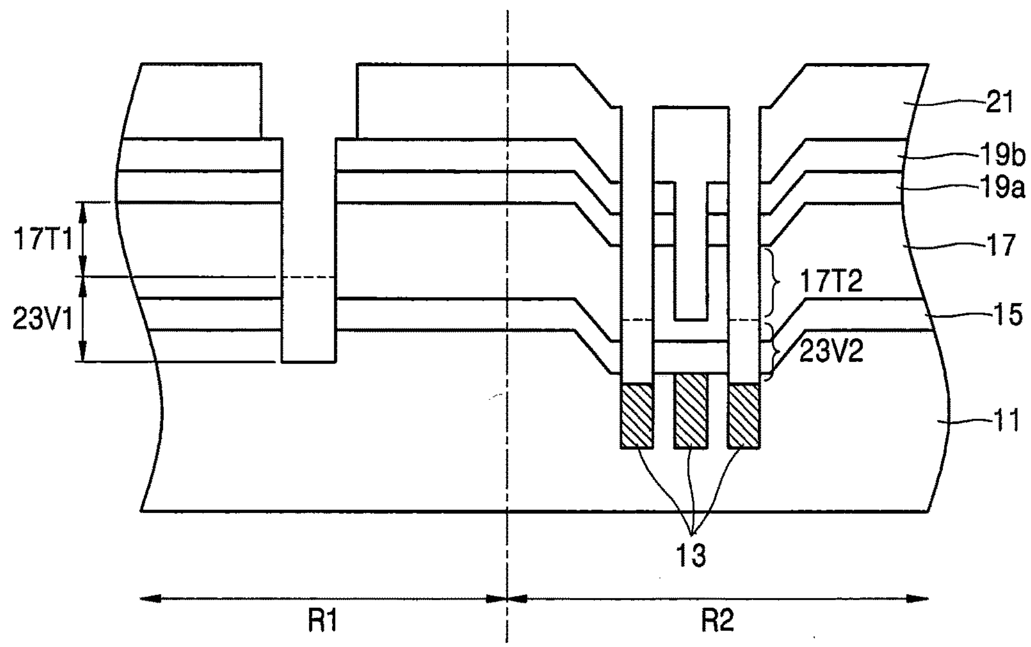

Referring to FIG. 7, an etching process may be performed on the entire surface of the resultant structure of FIG. 6 to form a first alignment mark via 23V1 and a first circuit region via 23V2. The first alignment mark via 23V1 may communicate with the first alignment mark trench 17T1, and the first circuit region via 23V2 may communicate with the second circuit pattern 17T2 and expose the top surface of the first circuit 13. The first circuit region via 23V2 may be formed by etching the portions of the first material layer 17 and the insulating layer 15 that are disposed under the first alignment mark trench 17T1 and the second circuit pattern 17T2 to expose the top surface of the first circuit 13. The first alignment mark via 23V 1 may be formed by etching the first material layer 17, the insulating layer 15, and a portion of the substrate 11 that is disposed under the first alignment mark trench 17T1. The etching process may be performed at the same time on both the first region R1 and the second region R2.

Even if the width D2 of the opening in the second mask pattern 21 that is used to form the first alignment mark via 23V1 is greater than the width D1 of the first alignment mark trench 17T1, the first alignment mark via 23V1 may have the same width as the first alignment mark trench 17T1, since the first mask pattern 19*a*, 19*b* that is disposed under the second mask pattern 21 may still function as a protection layer on the first material layer 17.

FIG. 7 illustrates a case in which the first circuit region via 23V2 exposes two out of three conductive elements that are part of the first circuit 13. However, the first circuit region via 23V2 of FIG. 7 is only an example and may be configured as appropriate based on, for example, the design of the first circuit 13. Thus it will be appreciated that the inventive concepts are not limited by the structure of the circuit formed in the second region R2.

Figure 8:
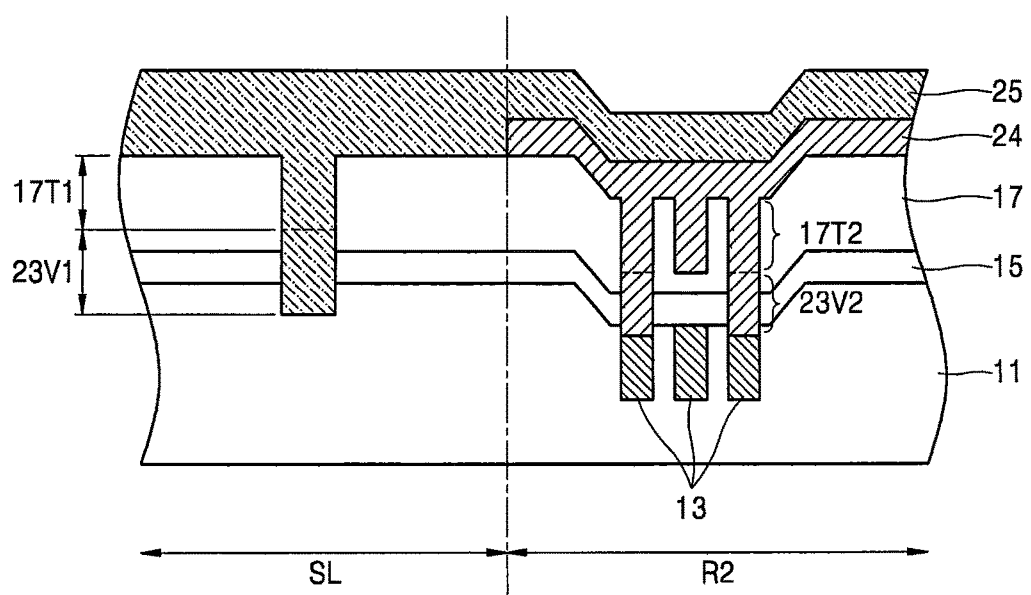

Referring to FIG. 8, the second mask pattern 21 and the first mask pattern 19*a*, 19*b* may be removed from the resultant structure of FIG. 7, and then a conductive material layer 24 and a light reflection material layer 25 may be sequentially formed on the resultant structure. The conductive material layer 24 may fill the second circuit pattern 17T2 and the first circuit region via 23V2, and the light reflection material layer 25 may fill the first alignment mark trench 17T1 and the first alignment mark via 23V1.

Specifically, a mask layer (not shown) may be formed on the first region R1 to cover the first alignment mark trench 17T1 and the first alignment mark via 23V1, and a conductive material layer 24 may be formed in the second region R2 that fills the second circuit pattern 17T2 and the first circuit region via 23V2. Thereafter, the mask layer may be removed from the first region R1, and the light reflection material layer 25 may be formed to fill the first alignment mark trench 17T1 and the first alignment mark via 23V1 in the first region R1.

Although FIG. 8 illustrates a case in which the light reflection material layer 25 is formed in both the first region R1 and the second region R2, the inventive concepts are not limited thereto. For example, in other embodiments, the light reflection material layer 25 may only be formed in the first region R1, and the conductive material layer 24 may only be formed in the second region R2.

In some embodiments, the light reflection material that is used to form the light reflection material layer may include at least one of a metal or an insulating material.

Figure 9A:
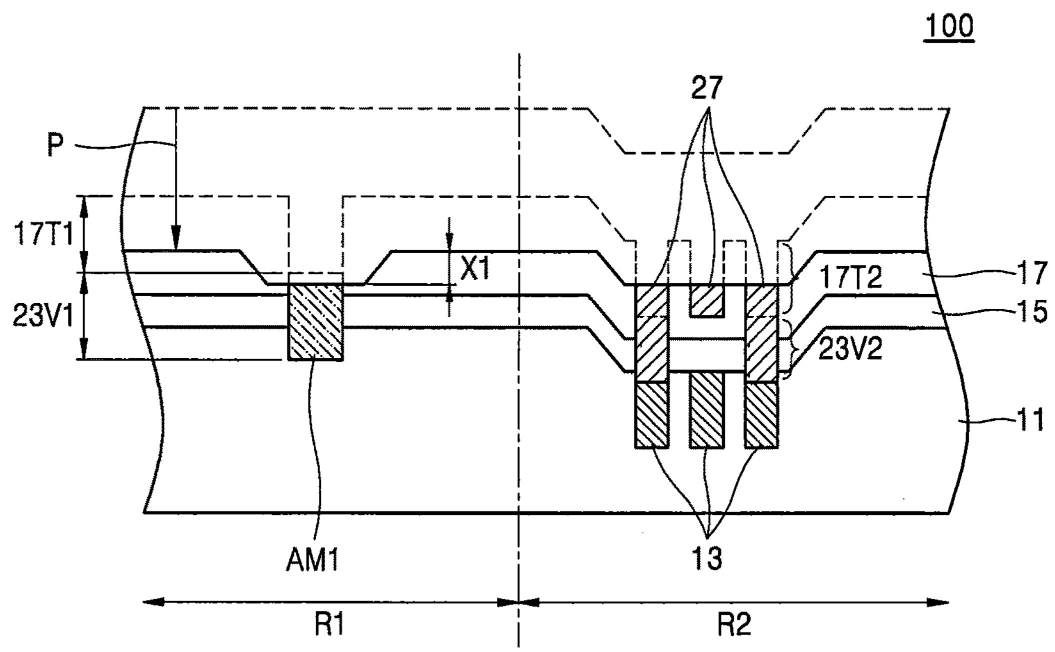

Referring to FIG. 9A, an etchback process P may be performed on the resultant structure of FIG. 8 so that a first alignment mark AM1 may be formed in the first region R1, and a second circuit 27 may be formed in the second region R2. As shown in FIG. 9A, the resultant structure may be etched more heavily in the vicinity of the first alignment mark AM1 so that a top surface of the first alignment mark AM1 may be at a lower level than a top surface of the first material layer 17 in the first region R1. The etchback process P may be performed on the entire surfaces of the first region R1 and the second region R2 until the conductive material layer 24 remains only in the first circuit region via 23V2 and the second circuit pattern 17T2 and is node-separated. However, a top surface of the second circuit 27 that is in the second region R2 should be at a higher level above the substrate 11 than is a bottom surface of the second circuit pattern 17T2 that is formed as described above with reference to FIG. 5 so that the second circuit 27 is not eliminated by the etch back process. The top surface of the first alignment mark AM1 of the first region R1 that is formed using the etchback process P may be at a lower level than a bottom surface of the first alignment mark trench 17T1 that is formed as described above with reference to FIG. 5.

As described above with reference to FIG. 3, a portion of the top surface of the second region R2 that includes the first circuit 13 may be at a lower level than the top surface of the first region R1 due to a difference in pattern density. As such, the bottom surface of the first alignment mark trench 17T1 in the first region R1 may be at a higher level above the bottom surface of the substrate 11 than is the bottom surface of the second circuit pattern 17T2 in the second region R2. Accordingly, even if an etching process is simultaneously performed on the entire surface of the structure including both the first and second regions R1 and R2, the first region R1 may be etched to a lower level than the bottom surface of the first alignment mark trench 17T1, while the second region R2 may be etched to a higher level than the bottom surface of the second circuit pattern 17T2 that is formed simultaneously with the first alignment mark trench 17T1. However, according to the example embodiments, since the first alignment mark via 23V1 is formed by filling a reflective material under the first alignment mark trench 17T1, even if the first alignment mark AM1 is etched to a lower level than the bottom surface of the first alignment mark trench 17T1, the first alignment mark AM1 may have a sufficient thickness.

Figure 9B:
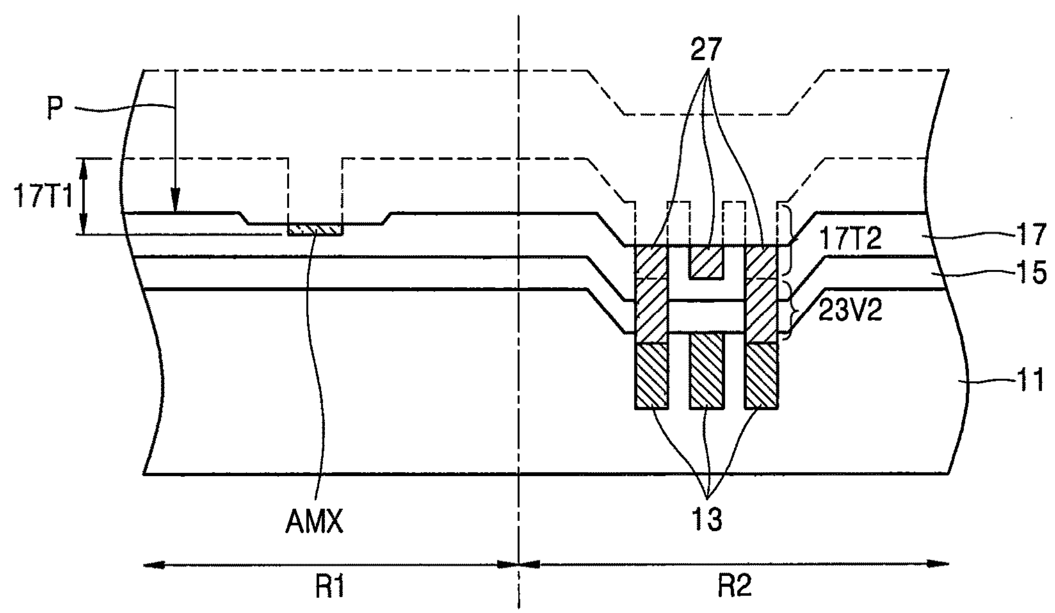

FIG. 9B illustrates a semiconductor device in which an alignment mark AMX is formed without undergoing a process of forming a first alignment mark via 23V1 in a first alignment mark trench 17T1.

Referring to FIG. 9B, an etching process may be performed on both the first region R1 and the second region R2 to remove an upper portion of a reflective material that is filled within a first alignment mark trench 17T1 and to remove upper portions of conductive materials that are filled in a second circuit pattern 17T2 and a second circuit region via 23V2. The etching process may form a second circuit 27. The second circuit 27 may be at a height above the bottom surface of the substrate 11 that is a level at which a node of the second circuit 27 is separated, to a higher level than a level of a lowermost surface of the second circuit pattern 17T2. Since a lowermost surface of the first alignment mark trench 17T1 is at a higher level above the bottom surface of the substrate 11 than is the lowermost surface of the second circuit pattern 17T2, the above-described etching process may excessively etch the alignment mark AMX so that it is formed to a very small thickness or may even completely remove the alignment mark AMX. As a result, alignment errors may arise between a reference layer and a subsequent layer and provoke overlay failures. As a result, the reliability of the semiconductor device may degrade.

Referring back to FIG. 9A, in order to reduce or eliminate overlay failures that may result due to excessive etching of an alignment mark caused by a step difference in first and second regions of a semiconductor device, a method of manufacturing the semiconductor device 10Q that includes a trench-via merged-type alignment mark is provided. According to the example embodiments, a trench, and a via that is configured to communicate with the trench, may be formed and used to form the alignment mark. Accordingly, the alignment mark may be formed not only in the reference layer that exposes the top surface of the alignment mark, but may also be formed in a layer that is disposed underneath the reference layer. Even though the etchback process may be performed on a substrate that has a step difference, the alignment mark has a sufficient thickness such that a sufficiently thick alignment mark may remain after the etching step is completed. Thus, the alignment mark may be available for precisely aligning subsequently deposited layers. Referring back to FIGS. 9A and 9B, the semiconductor device 100 in which the first alignment mark AM1 and the second circuit 27 are formed may be manufactured using the etchback process P. The first alignment mark AM1 may have a sufficient thickness after the etchback process is completed in spite of the step difference in the two regions R1 and R2.

The inventive concepts are not limited to any particular structure for the circuit that is formed in the second region. R2. The second circuit 27 shown in FIGS. 9A and 9B is only an example and may be variously changed according to circuit design.

In some embodiments, the second circuit 27 may be a metal interconnection.

Figure 10:
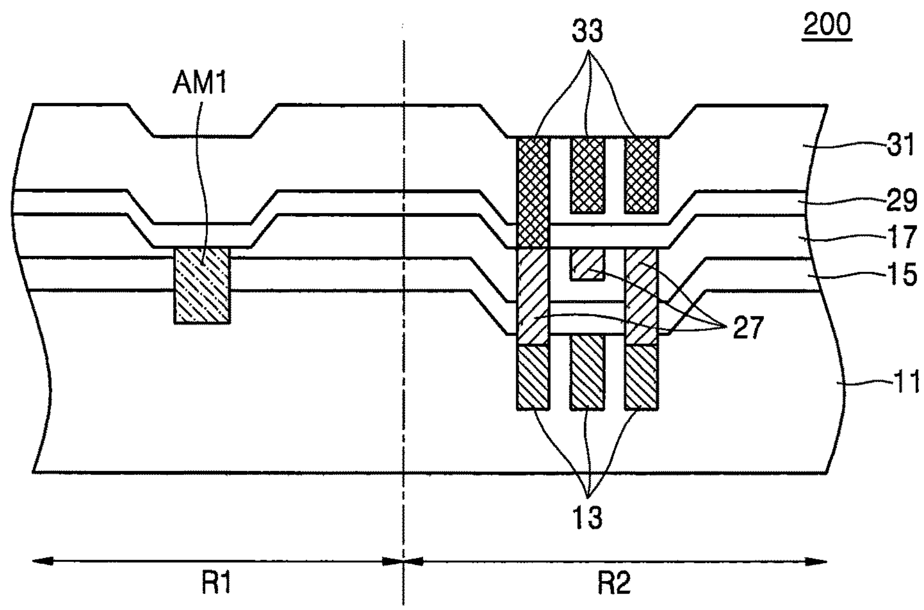
FIG. 10 is a cross-sectional view illustrating a method of manufacturing a semiconductor device according to further example embodiments of the inventive concepts.

Referring to FIG. 10, a semiconductor device 200 that includes a first alignment mark AM1 according to an example embodiment is illustrated. Upper and lower layers of the semiconductor device 200 may be precisely aligned using the first alignment mark AM1.

As shown in FIG. 9A, in the semiconductor device 100, top surfaces of the first alignment mark AM1 and the second circuit 27 are exposed. To form the semiconductor device 200 of FIG. 10, light may be radiated onto the top surface of the resultant structure of FIG. 9A, and a portion of this radiated light that is reflected by the first alignment mark AM1 may be detected, and an alignment position offset of the resultant structure of FIG. 9A may be obtained. Next, an insulating layer 29 and a third material layer 31 may be sequentially formed on the first material layer 17, and a third circuit pattern may be formed in the second material layer 31 that is aligned with the second circuit 27 included in the first material layer 17 using the alignment position offset. Thereafter, the third circuit pattern may be filled with a conductive material and etched back to form a third circuit 33. That is, the first alignment mark AM1 may be used to precisely align the second circuit 27 of the first material layer 17 with the third circuit 33 of the second material layer 31.

The inventive concepts are not limited by the structure of the circuit formed in the second region R2. Accordingly, it will be appreciated that the third circuit 33 shown in FIG. 10 is only an example and may be variously changed according to circuit design.

Figure 11:
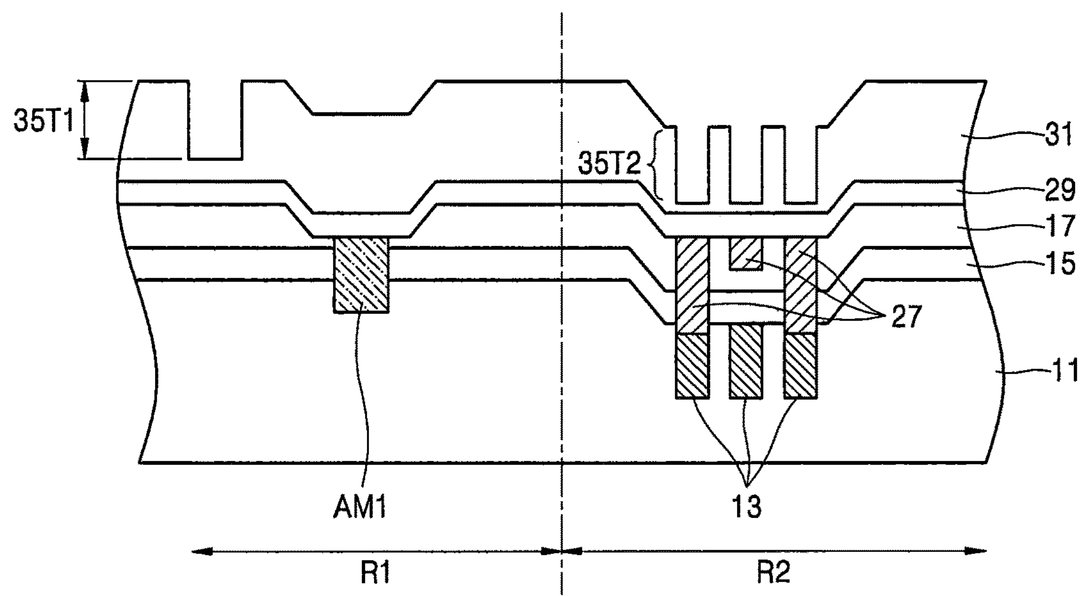
FIGS. 11 through 13 are cross-sectional views illustrating a method of manufacturing a semiconductor device according to additional example embodiments of the inventive concepts.
Figure 12:
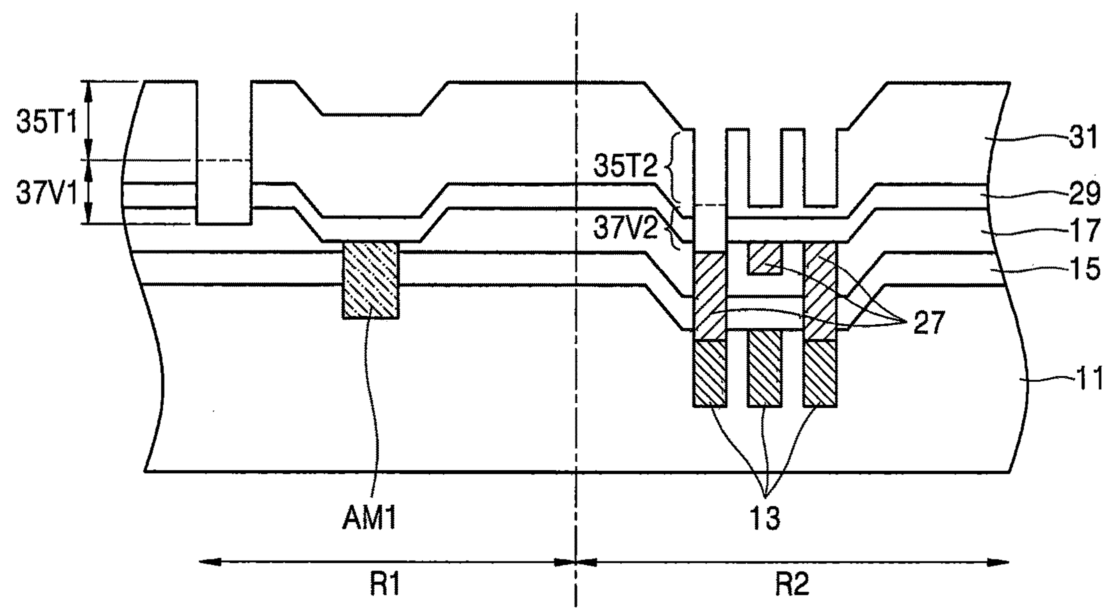
Figure 13:
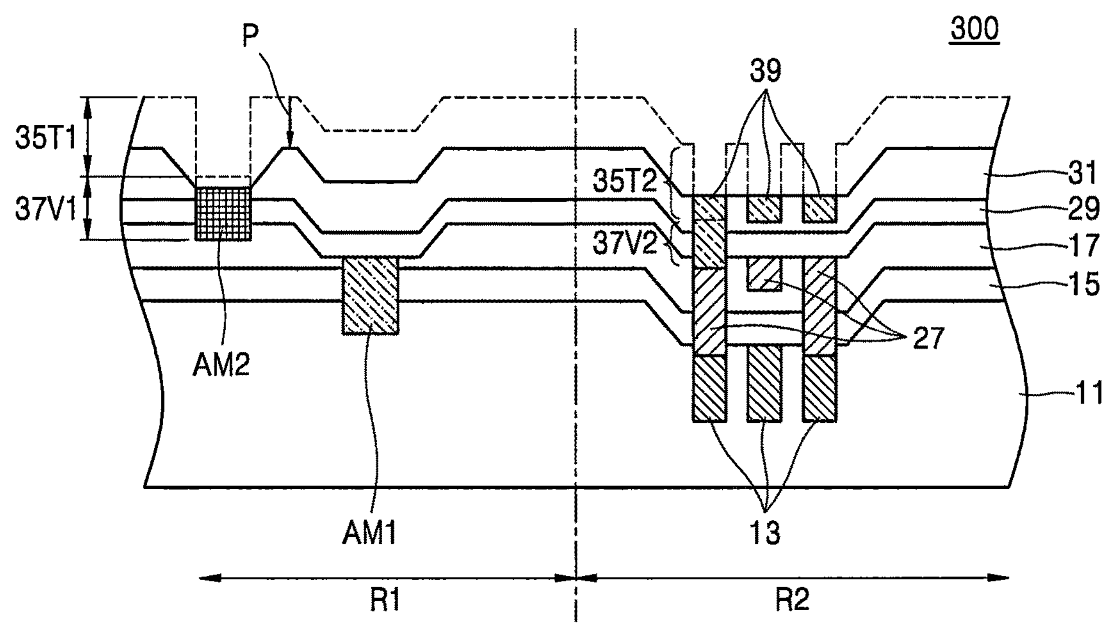

FIGS. 11 through 13 are cross-sectional views illustrating a method of manufacturing a semiconductor device 300 according to example embodiments.

An integrated circuit (IC) forming a semiconductor device may include a plurality of stacked layers, and the IC may be manufactured using a plurality of photomask patterns that define circuit patterns. The photomask patterns should be precisely aligned with one another. As in the above-described semiconductor device 200, the photomask patterns may be aligned using the first alignment mark AM1. However, as later-formed material layers may be stacked on a material layer on which an initial alignment mark is formed, the later-formed material layers may cover the initial alignment mark and prevent detection of the initial alignment mark. Accordingly, an additional second alignment mark AM2 may be formed on a material layer that is stacked on an underlying material layer that includes the initial alignment mark (i.e., the first alignment mark AM1).

FIG. 11 illustrates the semiconductor device in which a third circuit and a second alignment mark as described below with reference to FIG. 13 are further formed on the second circuit 27 of the first material layer 17 in the semiconductor device 10Q shown in FIGS. 3 through 9.

Specifically, the first alignment mark AM1 and the second circuit 27 formed on the first material layer 17 may be exposed on a top surface of the resultant structure of FIG. 9A. An insulating layer 29 and a second material layer 31 may be formed on the top surface of the resultant structure of FIG. 9A. Thereafter, a second alignment mark trench 35T1 may be formed in the second material layer 31 in the first region R1. Patterns in the first material layer 17 and patterns in the second material layer 31 may be aligned with each other using the first alignment mark AM1.

In some embodiments, the second alignment mark trench 35T1 may be offset horizontally from the first alignment mark AM1. As a result, when light is radiated onto the resultant structure for use of a second alignment mark (not shown) that is formed using the second alignment mark trench 35T1, interference between light reflected by the first alignment mark AM1 and light reflected by the second alignment mark may be reduced or prevented.

In the second region R2, a third circuit pattern 35T2 may be formed in the second material layer 31 that is aligned with the second circuit 27 that is included in the underlying first material layer 17.

Referring to FIG. 12, a second alignment mark via 37V1 and a second circuit region via 37V2 may be formed. The second alignment mark via 37V1 may communicate with the second alignment mark trench 35T1, and the second circuit region via 37V2 may communicate with the third circuit pattern 35T2 and may expose a top surface of the second circuit 27. The second circuit region via 37V2 may be formed by etching portions of the second material layer 31 and the insulating layer 29 that are disposed under the third circuit pattern 35T2 to expose at least part of a top surface of the second circuit 27. The second alignment mark via 37V1 may be formed by etching portions of the second material layer 31, the insulating layer 29, and the first material layer 17 that are disposed under the second alignment mark trench 35T1. The above described etching processes may be performed simultaneously in the first and second regions R1 and R2.

Referring to FIG. 13, the third circuit pattern 35T2 and the second circuit region via 37V2 may be filled with a conductive material, and the second alignment mark trench 35T1 and the second alignment mark via 37V1 may be filled with a light reflection material. Thereafter, an etchback process may be performed to form the second alignment mark AM2 and a third circuit 39.

Specifically, a mask layer (not shown) may be formed in the first region R1 to cover the second alignment mark trench 35T1 and the second alignment mark via 37V1, and a conductive material may be deposited in the second region R2 to fill the third circuit pattern 35T2 and the second circuit region via 37V2. Thereafter, the mask layer may be removed from the first region R1, and a light reflection material may be deposited in the first region R1 to fill the second alignment mark trench 35T1 and the second alignment mark via 37V1. In some embodiments, the light reflection material may be deposited in the first region R1 before the conductive material is deposited in the second region R2.

Thereafter, an etchback process P may be performed on the resultant structure. The etchback process P may be performed so that the conductive material layer remains only in the second circuit region via 37V2 and the third circuit pattern 35T2 and is node-separated, and so that a top surface of the third circuit 39 is at a higher level than a bottom surface of the second circuit region pattern 35T2 that is formed as described above with reference to FIG. 11. The etchback process P may be performed on the entire surfaces of the first and second regions R1 and R2 under the same conditions. The top surface of the second region R2 may include a portion that is at a lower level than the top surface of the first region R1 due to the step difference caused by a difference in pattern density. As such, if the semiconductor device of FIG. 9B is used as a starting point for the processing steps described above with reference to FIGS. 11-13, the top surface of the first region R1 may be at a lower level than a bottom surface of the second alignment mark trench 35T1 that is formed as described above with reference to FIG. 11. However, according to the example embodiments, if the semiconductor device 100 of FIG. 9A is used as a starting point for the processing steps described above with reference to FIGS. 11-13, since the second alignment mark via 37V1, which may communicate with the second alignment mark trench 35T1, is formed in addition to the second alignment mark trench 35T1 to form the second alignment mark AM2, even if excessive etching occurs in the vicinity of the second alignment mark AM2, sufficient reflective material is deposited so that the second alignment mark AM2 remains after the etching process is completed. Detailed descriptions thereof are the same as described above with reference to FIGS. 3 through 10.

FIGS. 11 through 13 illustrate a case in which only one insulating layer is formed between the first material layer 17, in which the first alignment mark AM1 is formed, and the second material layer 31, in which the second alignment mark AM2 is formed, but the inventive concepts are not limited thereto. In some embodiments, a plurality of material layers that do not include alignment marks may be included between the first material layer 17 and the second material layer 31.

Figure 14:
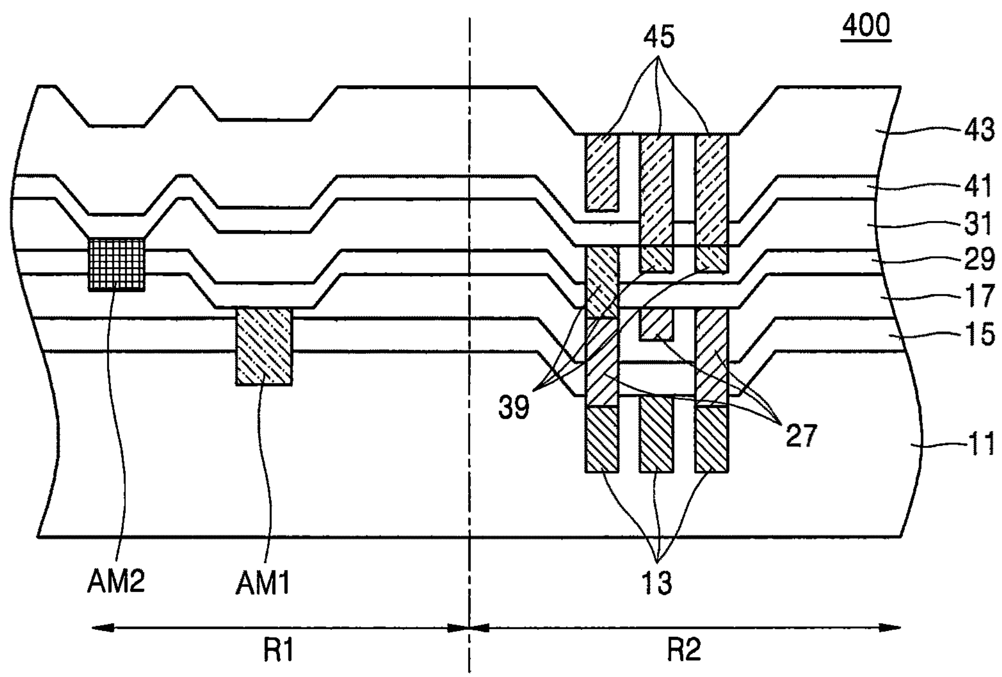
FIG. 14 is a cross-sectional view illustrating a method of manufacturing a semiconductor device according to still further example embodiments of the inventive concepts.

FIG. 14 is a cross-sectional view illustrating a method of manufacturing a semiconductor device 400 according to example embodiments.

Referring to FIG. 14, the semiconductor device 400 according to an example embodiment includes a second alignment mark AM2. The second alignment mark AM2 may be used to precisely align upper and lower layers with one another.

Specifically, light may be radiated on to a top surface of the resultant structure of FIG. 13, and a portion of this light that is reflected by the second alignment mark AM2 may be detected, and an alignment position offset of the resultant structure of FIG. 13 may be obtained. Thereafter, an insulating layer 41 and a third material layer 43 may be sequentially formed on the second material layer 31, and the alignment position offset may be used to form a fourth circuit pattern in the third material layer 43 that is aligned with the third circuit 39 that is included in the second material layer 31. Thereafter, the fourth circuit pattern may be filled with a conductive material, and an etchback process may be performed to form a fourth circuit 45.

In some embodiments, both the first alignment mark AM1 and the second alignment mark AM2 may be used to align the fourth circuit 45 with an underlying layer. That is, light may be radiated onto the top surface of the resultant structure, and the alignment position offset may be obtained by detecting both light reflected by the first alignment mark AM1 and light reflected by the second alignment mark AM2.

The inventive concepts are not limited by the structure of the circuit formed in the second region R2. The fourth circuit 44 shown in FIG. 14 is only an example and may be variously changed according to circuit design.

Figure 15:
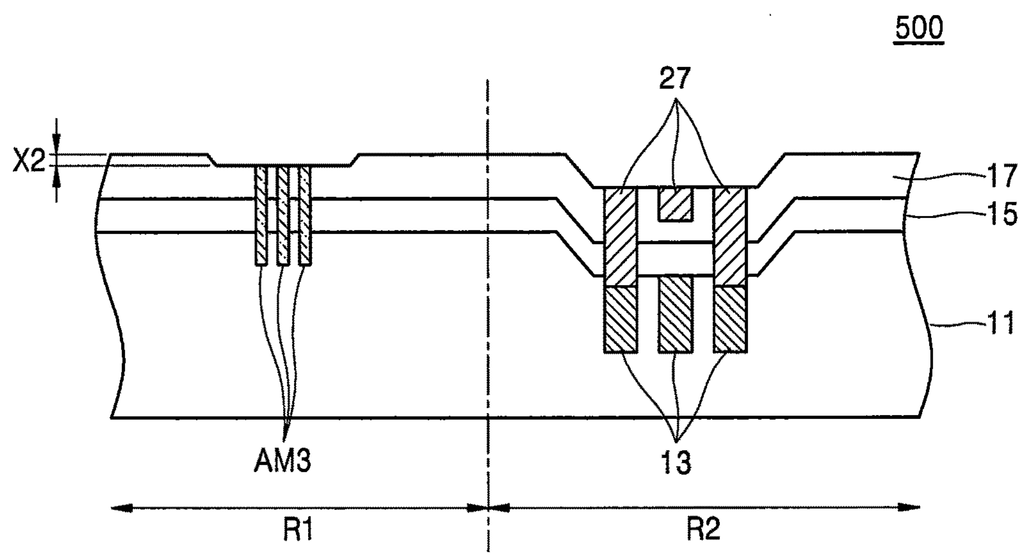
FIG. 15 is a cross-sectional view illustrating a method of manufacturing a semiconductor device according to yet additional example embodiments of the inventive concepts.

FIG. 15 is a cross-sectional view illustrating a method of manufacturing a semiconductor device 500 according to example embodiments.

The semiconductor device 500 includes a slit-type alignment mark AM3, which has a different shape from the first alignment mark AM1 that is formed in the semiconductor device 100 described with reference to FIGS. 3 through 9.

The semiconductor 500 of FIG. 15 may be formed using the same method described above with reference to FIGS. 3 through 9A to form the semiconductor device 100 of FIG. 9A, except that the pattern shapes of the first mask pattern 19*a*, 19*b*, the first alignment mark trench 17T1, and the first alignment mark via 23V1 described with reference to FIGS. 4 through 9A define a plurality of slits instead of defining a single trench.

Referring back to FIGS. 4 and 5, a first mask pattern 19*a*, 19*b* for patterning an alignment mark and a second circuit may be formed on the resultant structure of FIG. 4, except that the first mask pattern may define a plurality of slits in the first region R1. The first material layer 17 may be etched using the first mask pattern 19*a*, 19*b* as an etch mask. As a result, a slit-type first alignment mark trench 17T1 and a second circuit pattern 17T2 may be formed in the first material layer 17.

Referring to FIG. 6, a second mask pattern 21 may be formed on the resultant structure of FIG. 5 to define a via and a slit-type via. The via may communicate with the second circuit pattern 17T2 and be connected to the first circuit 13, and the slit-type via may communicate with the slit-type first alignment mark trench 17T1.

Referring to FIG. 7, an etching process may be performed on the entire surface of the resultant structure of FIG. 6.

Referring to FIG. 8, the second mask pattern 21 and the first mask pattern 19*a*, 19*b* may be removed from the resultant structure of FIG. 7. Thereafter, a conductive material layer 24 may be formed to fill the second circuit pattern 17T2 and the first circuit region via 23V2, and a light reflection material layer 25 may be formed to fill the slit-type first alignment mark trench 17T1 and the slit-type first alignment mark via 23V1.

Referring back to FIG. 9, an etchback process P may be performed on the resultant structure of FIG. 8, thereby manufacturing the semiconductor device 500 including the slit-type alignment mark AM3.

The slit-type alignment mark AM3 may include a wall that defines a plurality of slits. In general, an etchback process may be performed on an alignment mark and a circuit. In this case, a step difference may occur due to a difference in pattern density between the alignment mark and the circuit. The difference in pattern density between a portion of the structure in which the alignment mark is formed and a portion of the structure in which the circuit is formed may be reduced by use of the slit-type alignment mark AM3. As a result, the magnitude the step difference may be reduced.

Referring back to FIG. 9, when the etchback process P is performed, a top surface of the first alignment mark AM1 may be a first depth X1 lower than a top surface of the first material layer 17. Referring to FIG. 15, when the etchback process P is performed, a top surface of the slit-type alignment mark AM3 may be a second depth X2 lower than the top surface of the first material layer 17. Here, the second depth X2 may be less than the first depth X1. Thus, a smaller step difference may occur.

Accordingly, in the semiconductor device 500 according to an example embodiment that includes the slit-type alignment mark AM3, a high-quality alignment mark may be formed without the influence of the previously caused step difference, and the occurrence of an additional step difference may be inhibited.

Figure 16A:
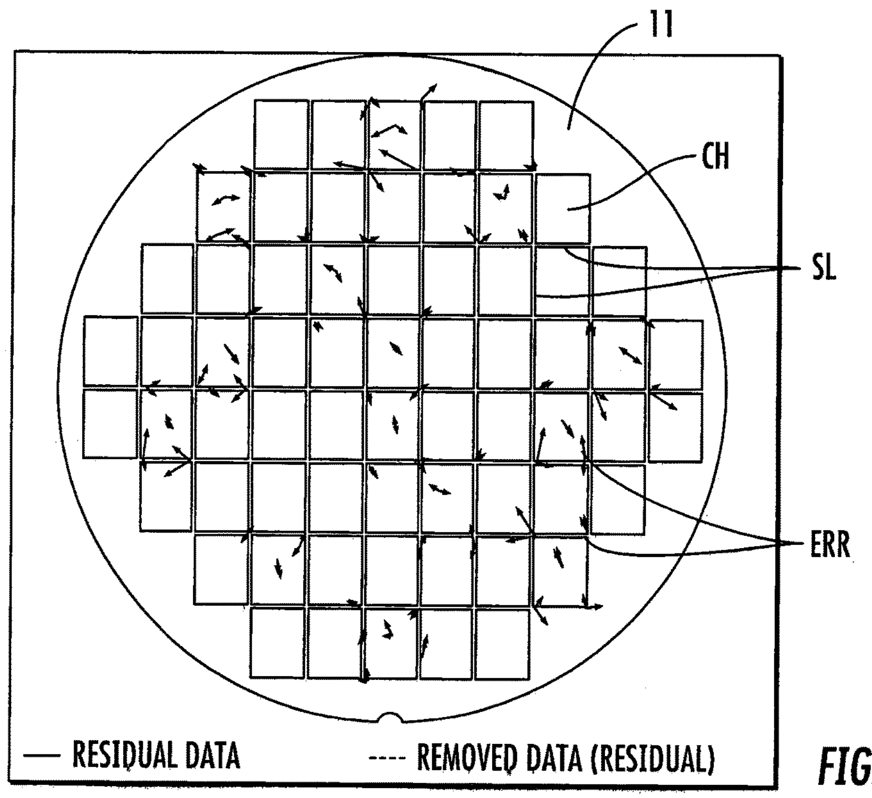
FIGS. 16A and 16B are plan views of, respectively, an overlay map of a semiconductor device manufactured according to an example embodiment of the inventive concepts and an overlay map of a semiconductor device manufactured using a conventional manufacturing method.
Figure 16B:
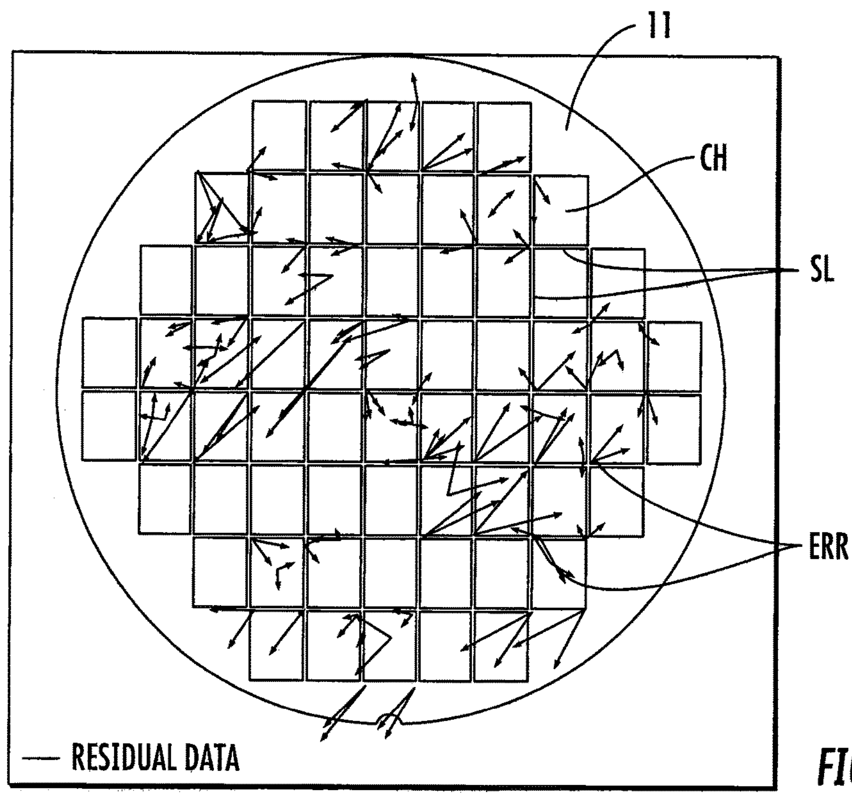

FIGS. 16A and 16B are plan views of semiconductor devices that illustrate an overlay map of a semiconductor device manufactured according to an example embodiment and an overlay map of a semiconductor device manufactured using a conventional method.

FIG. 16A illustrates an overlay map of the first, second, and slit-type alignment marks AM1, AM2, and AM3 included in the semiconductor devices 100, 200, 300, 400, and 500 manufactured according to the example embodiments. As shown in FIG. 16A, a plurality of chip regions CH and scribe lane regions S1, are formed on a substrate 11. An overlay ERR may indicate a misalignment between patterns. An overlay value may indicate an absolute value of a numerical value of a particular misalignment between layers. Measurements indicated that an average overlay value of 5.44 nm was obtained when the first, second, and slit-type alignment marks AM1, AM2, and AM3 were used. In this case, it may be inferred that layers are normally aligned using an alignment mark.

FIG. 16B illustrates an overlay map of a semiconductor device manufactured according to a conventional method. In this case, an average overlay value of 14.38 nm was obtained, which may cause failures in operations of an IC that requires precisely aligned layers.

Figure 17A:
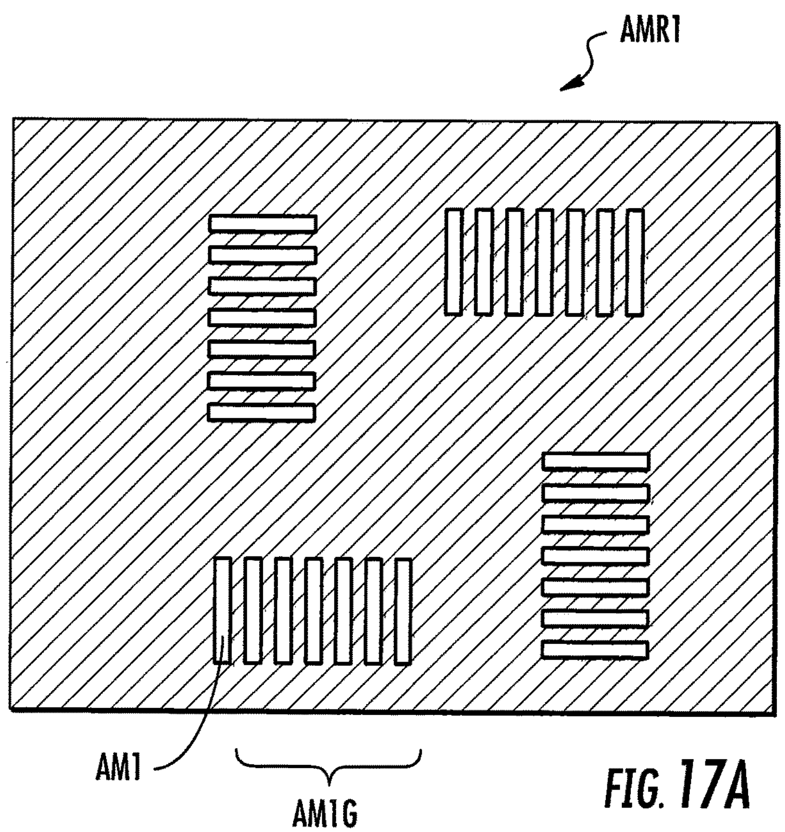
FIGS. 17A through 17C are plan views of, respectively, alignment marks included in semiconductor devices manufactured according to example embodiments of the inventive concepts and an alignment mark included in a semiconductor device manufactured using a conventional method.
Figure 17B:
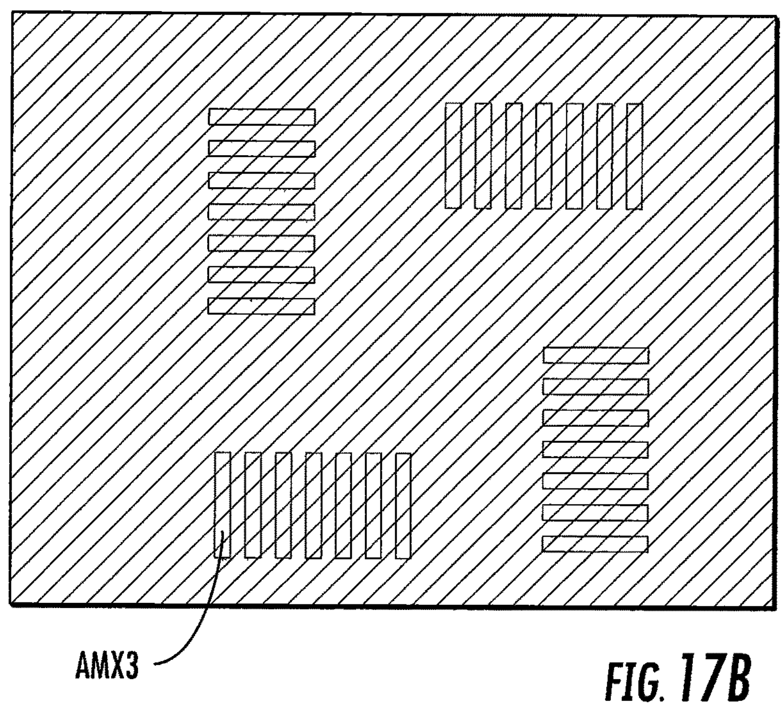
Figure 17C:
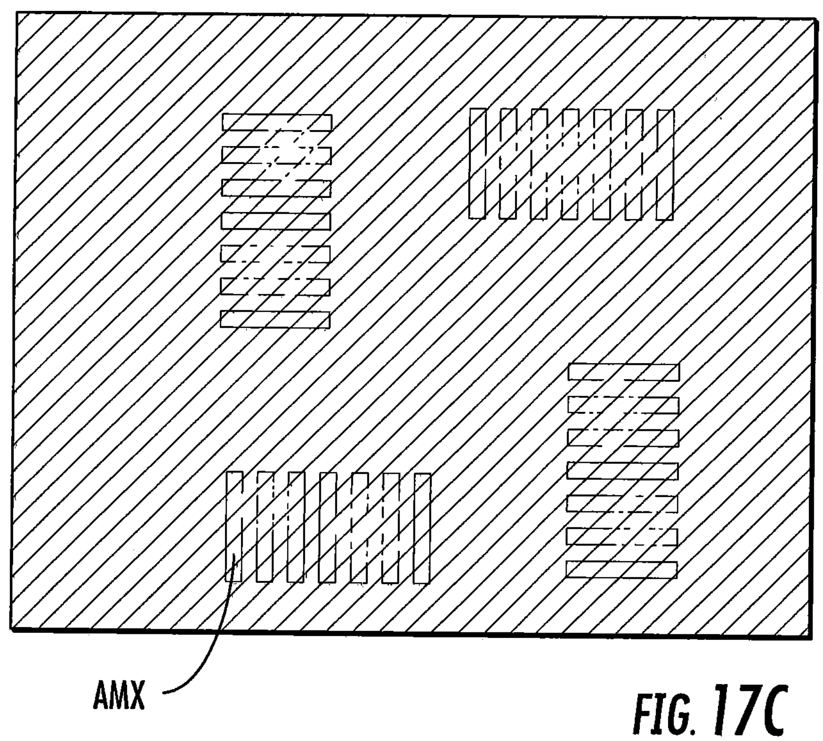

FIGS. 17A through 17B are plan views of the first alignment marks AM1 and the slit-type alignment marks AM3, respectively, that are included in the semiconductor devices 100 and 500 manufactured according to example embodiments. FIG. 17C is a plan view of an alignment mark included in a semiconductor device manufactured using a conventional method.

FIG. 17A illustrates a first alignment mark region AMR1 in which the first alignment mark AM1 that is included in the semiconductor device 100 manufactured according to an example embodiment as described with reference to FIGS. 3 through 9A is disposed. When light is radiated onto a substrate including the first alignment mark AM1, light reflected by the first alignment mark AM1 may be clear and exhibit good quality. Thus, a position of each alignment mark may be clearly detected and used to align layers.

FIG. 17B illustrates a slit-type alignment mark region AMR3 in which the slit-type alignment mark AM3 that is included in the semiconductor device 500 manufactured according to an example embodiment as described with reference to FIG. 15 is disposed. Similar to the first alignment mark AM1 of FIG. 17A, light reflected by the slit-type alignment mark AM3 may be clear and exhibit good quality.

FIG. 17C illustrates results obtained by radiating light onto an alignment mark AMX manufactured according to a conventional method. The alignment mark AMX manufactured according to the conventional method may not properly reflect light but may instead appear dark. Therefore, it may be inferred that because of the step difference in the substrate the alignment mark AMX is too thin to reflect sufficient light or may have been lost altogether due to excessive etching.

Referring back to FIG. 17A, a plurality of first alignment marks AM1 may be provided, and some of these first alignment marks AM1 may form an alignment mark group AM1G. Also, a plurality of first alignment mark groups AM1G may be provided and variously disposed to form the first alignment mark region AMR.

FIG. 17A illustrates a case in which all of the first alignment marks AM1 have the same shape and are disposed a predetermined distance apart from one another, but the inventive concepts are not limited thereto. In some embodiments, at least two of the first alignment marks AM1 may have different shapes and/or may be variously disposed.

In some embodiments, the first alignment mark region AMR1 may be disposed in the alignment mark region AM of FIG. 2.

The number and disposition of the first alignment marks AM1 described in the present embodiment may be applied to the second alignment mark AM2 and the third alignment mark AM3 described with reference to FIGS. 10 through 15.

The first, second, and slit-type alignment marks AM1, AM2, and AM3 formed using the methods of manufacturing the semiconductor devices 100, 200, 300, 400, and 500 described with reference to FIGS. 3 through 15 may be used for a process monitoring method. That is, the process monitoring method may include radiating light to a material layer including the first, second, or slit-type alignment mark AM1, AM2, or AM3, detecting light reflected by the first, second, or slit-type alignment mark AM1, AM2, or AM3, obtaining an alignment position offset of the first, second, or slit-type alignment mark AM1, AM2, or AM3 formed in the material layer, and obtaining information regarding each position of a substrate using the alignment position offset.

In some embodiments, the information obtained using the alignment position offset may be information regarding a thickness of the substrate at each position. For example, even if reliability is degraded during the measuring of the thickness of the substrate due to copper (Cu) dishing, a sufficient Cu thickness may be ensured and utilized for the measuring of the thickness of the substrate by using the above-described method of forming the trench-via-merged-type alignment marks, namely, first, second, and slit-type alignment marks AM1, AM2, and AM3.

Figure 18:
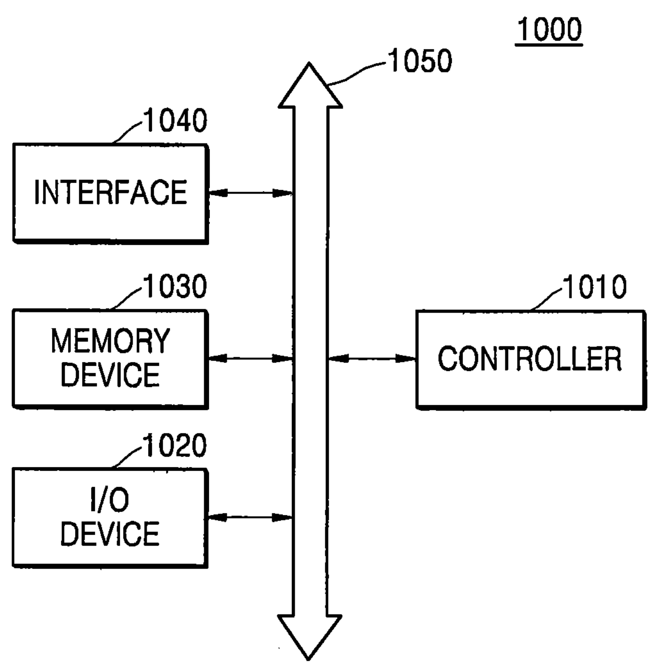
FIG. 18 is a diagram of a system including a semiconductor device having an alignment mark formed according to an example embodiment of the inventive concepts.

FIG. 18 is a diagram of a system 1000 including the semiconductor device 100, 200, 300, 400, or 500 having alignment marks formed according to an example embodiment.

Referring to FIG. 18, the system 1000 may include a controller 1010, an input/output (I/O) device 1020, a memory device 1030, and an interface 1040. The system 1000 may be a mobile system or a system configured to transmit or receive information. In some embodiments, the system may be a personal digital assistant (PDA), a portable computer, a web tablet, a wireless phone, a mobile phone, a digital music player, or a memory card. The controller 1010 may be configured to control an execution program in the system 1000. The controller 1010 may be embodied by a microprocessor (MP), a digital signal processor (DSP), a microcontroller (MC), or a device similar thereto.

The I/O device 1020 may be used to input or output data of the system 1000. The system 1000 may be connected to an external device (e.g., a personal computer (PC) or a network) using the I/O device 1020 and exchange data with the external device. The I/O device 1020 may be, for example, a keypad, a keyboard, or a display.

The memory device 1030 may store codes and/or data for operations of the controller 1010 or store data processed by the controller 1010. The memory device 1030 may include the semiconductor device 100, 200, 300, 400, or 500 having alignment marks according to example embodiments. For example, the memory device 1030 may include at least one of the semiconductor devices 100, 200, 300, 400, and 500 described above with reference to FIGS. 2 through 15.

The interface 1040 may be a path through which data is transmitted and received between the system 1000 and other external devices. The controller 1010, the I/O device 1020, the memory device 1030, and the interface 1040 may communicate with one another through a bus 1050. The system 1000 may be used for a mobile phone, an MPEG-1 audio layer 3 (MP3) player, a navigation device, a portable multimedia player (PMP), a solid-state disk (SSD), or household appliances.

Figure 19:
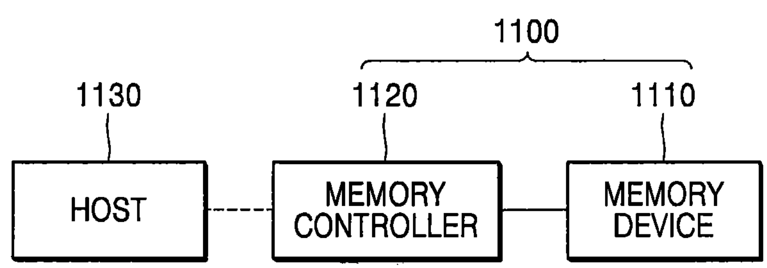
FIG. 19 is a diagram of a memory card including a semiconductor device having an alignment mark formed according to an example embodiment of the inventive concepts.

FIG. 19 is a diagram of a memory card 1100 including the semiconductor device 100, 200, 300, 400, or 500 having alignment marks formed according to an example embodiment.

Referring to FIG. 19, the memory card 1100 may include a memory device 1110 and a memory controller 1120.

The memory device 1110 may store data. In some embodiments, the memory device 1110 may be a non-volatile memory capable of retaining stored data even if the power supply to the device is interrupted. The memory device 1110 may include a semiconductor device according to example embodiments. For example, the memory device 1110 may include at least one of the semiconductor devices 100, 200, 300, 400, and 500 described above with reference to FIGS. 2 through 15.

The memory controller 1120 may read data stored in the memory device 1110 or store data in the memory device 1110 in response to read/write requests of a host 1130. The memory controller 1120 may include a semiconductor device according to example embodiments. For example, the memory controller 1120 may include at least one of the semiconductor devices 100, 200, 300, 400, and 500 described above with reference to FIGS. 2 through 15.

While the inventive concepts have been particularly shown and described with reference to example embodiments thereof, it will be understood that various changes in form and details may be made therein without departing from the spirit and scope of the following claims.

What is claimed is:

1. A method of manufacturing a semiconductor device, the method comprising:
  - sequentially forming a second material layer and then a first material layer on a top surface of a substrate;
  - forming a first alignment mark trench in the first material layer;
  - forming a first alignment mark via under the first alignment mark trench by etching the second material layer, wherein the first alignment mark via is in communication with the first alignment mark trench;
  - forming a trench-via-merged-type first alignment mark by at least partially filling the first alignment mark trench and the first alignment mark via with a light reflection material layer; and
  - using the trench-via-merged-type first alignment mark to align a pattern in a third material layer with a pattern in at least one of the first or second material layers.

2. The method of claim 1, further comprising forming a first circuit pattern in the first material layer simultaneously with the forming of the first alignment mark trench in the first material layer, forming a first circuit region via in the second material layer that is in communication with the first circuit pattern simultaneously with the forming of the first alignment mark via in the second material layer, and at least partially filling the first circuit pattern and the first circuit region via to form a first circuit pattern.

3. The method of claim 2, further comprising:
  - forming the third material layer after forming the first circuit and the first alignment mark;
  - forming a second alignment mark trench in the third material layer;
  - forming a second alignment mark via that is in communication with the second alignment mark trench; and
  - forming a second alignment mark by at least partially filling the second alignment mark via and the second alignment mark trench with a light reflection material.

4. The method of claim 3, wherein the second alignment mark trench is formed at a different position from the first alignment mark trench in the substrate in a direction parallel to the substrate.

5. The method of claim 3, further comprising:
  - forming a second circuit pattern in the third material layer simultaneously with the forming of the second alignment mark trench in the third material layer, forming a second circuit region via in the third material layer that is in communication with the second circuit pattern simultaneously with the forming of the second alignment mark via, and at least partially filling the second circuit pattern and the second alignment mark via with a conductive material.

6. The method of claim 1, wherein forming the first alignment mark via comprises forming a mask pattern on the first material layer that has an opening above the first alignment mark trench,
  - wherein a first width of the first alignment mark trench is less than a second width of the opening.

7. The method of claim 1, wherein the first alignment mark trench includes at least one wall defining a plurality of slits.

8. The method of claim 1, wherein the light reflection material includes a metal and/or an insulating material.

9. The method of claim 1, wherein forming the first alignment mark trench comprises forming a multi-layer hard mask pattern on the first material layer.

10. The method of claim 1, further comprising forming a fourth material layer between the first material layer and the second material layer using the first alignment mark to align a pattern in the fourth material layer with a pattern in the first material layer.

11. A method of manufacturing a semiconductor device, the method comprising:
  - forming a first layer on a substrate;
  - forming an alignment mark trench in the first layer;
  - forming a mask pattern on the first layer, the mask pattern having an opening above the alignment mark trench;
  - forming an alignment mark via in a second layer that is in communication with the alignment mark trench by etching the second layer using the mask pattern as an etch mask;
  - forming an alignment mark by at least partially filling the alignment mark trench and the alignment mark via with a light reflection material;
  - forming a third layer on the first layer;
  - using the alignment mark to align a pattern in the third layer with a pattern in the first and/or second layers.

12. The method of claim 11, further comprising forming a circuit pattern in a chip region of the substrate simultaneously with the formation of the alignment mark trench, forming a circuit region via that is communication with the circuit pattern simultaneously with the formation of the alignment mark via, and at least partially filling the circuit pattern and the circuit region via with a conductive material.

13. The method of claim 11, wherein a plurality of alignment marks are formed, and at least one of the plurality of alignment marks is formed in a chip region of the substrate.

14. The method of claim 11, wherein a plurality of alignment marks are formed, and at least one of the plurality of alignment marks is formed in a scribe lane region of the substrate.

15. A method of manufacturing a semiconductor device, the method comprising:
  - forming a first circuit pattern in a recess in a surface of a first portion of the substrate;
  - sequentially forming a second material layer and a first material layer on the surface of the substrate that includes the first circuit pattern;
  - forming an alignment mark trench in the first material layer;
  - etching the second material layer underneath the alignment mark trench to form an alignment mark via in the second material layer under the alignment mark trench;
  - depositing a reflective material in the alignment mark trench and in the alignment mark via;
  - forming an alignment mark by removing at least some of the reflective material;

forming a third material layer on the first material layer; and detecting light reflected from the alignment mark to determine an alignment position offset that is used to form an opening in the third material layer that is aligned with the first circuit pattern or a pattern in the first material layer, the second material layer and/or the substrate.

16. The method of claim 15, wherein the alignment mark via extends all the way through the second material layer and into a top surface of a second portion of the substrate, the second portion is different from the first portion.

17. The method of claim 15, wherein removing at least some of the reflective material comprises removing all of the reflective material that was deposited in the alignment mark trench.

18. The method of claim 15, wherein etching the second material layer underneath the alignment mark trench to form the alignment mark via in the second material layer comprises forming a mask pattern having an opening above the alignment mark trench on the first material layer and then etching the second material layer using the mask pattern as an etching mask, wherein the opening in the mask pattern has a width that exceeds a width of the alignment mark trench.

19. The method of claim 15, further comprising forming a second circuit pattern in the first material layer in the same processing operation that forms the alignment mark trench in the first material layer.

20. The method of claim 18, wherein the mask pattern comprises a multi-layer mask pattern.

* * * * *